United States Patent
Ji et al.

(10) Patent No.: US 8,199,502 B2
(45) Date of Patent: Jun. 12, 2012

(54) HEAT DISSIPATING DEVICE

(75) Inventors: Jin-Biao Ji, Shenzhen (CN); Zhi-Guo Zhang, Shenzhen (CN); Li-Fu Xu, Shenzhen (CN)

(73) Assignees: Hong Fu Jin Precision Industry (ShenZhen) Co., Ltd., ShenZhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 127 days.

(21) Appl. No.: 12/723,709

(22) Filed: Mar. 15, 2010

(65) Prior Publication Data
US 2011/0149514 A1 Jun. 23, 2011

(30) Foreign Application Priority Data
Dec. 17, 2009 (CN) .................. 2009 2 0317673 U

(51) Int. Cl.
*H05K 7/20* (2006.01)
(52) U.S. Cl. ............... 361/697; 361/703; 361/719
(58) Field of Classification Search .............. 361/697, 361/703
See application file for complete search history.

(56) References Cited

U.S. PATENT DOCUMENTS

| | | | | |
|---|---|---|---|---|
| 5,794,685 | A * | 8/1998 | Dean ........................... | 165/121 |
| 7,193,849 | B2 * | 3/2007 | Xu et al. ..................... | 361/695 |
| 7,545,643 | B2 * | 6/2009 | Li et al. ....................... | 361/697 |
| 2002/0018336 | A1 * | 2/2002 | Liang et al. ................. | 361/697 |
| 2005/0141193 | A1 * | 6/2005 | Otsuki et al. ............... | 361/695 |
| 2008/0066898 | A1 * | 3/2008 | Lai et al. ..................... | 165/185 |
| 2008/0170364 | A1 * | 7/2008 | Li et al. ....................... | 361/692 |
| 2009/0244844 | A1 * | 10/2009 | Liao et al. ................... | 361/697 |
| 2009/0262505 | A1 * | 10/2009 | Lin ............................... | 361/709 |
| 2011/0141700 | A1 * | 6/2011 | Liu et al. ..................... | 361/720 |

* cited by examiner

*Primary Examiner* — Gregory Thompson
(74) *Attorney, Agent, or Firm* — Altis Law Group, Inc.

(57) ABSTRACT

A heat dissipating device includes a heat sink and a fan. The heat sink includes a base configured to contact a heat generating element, and a plurality of fins extending from the base. The base defines an axis. Each fin includes an end portion extending about the axis of the base in one of a clockwise direction and an anti-clockwise direction. The fan is placed on the heat sink. The fan defines a first opening and a second opening adjacent to the base. The fan is operating and pivoted about the axis of the base in the other one of a clockwise direction and an anti-clockwise direction.

14 Claims, 3 Drawing Sheets

HEAT DISSIPATING DEVICE

BACKGROUND

1. Technical Field

The disclosure generally relates to heat dissipating devices, especially to a heat dissipating device having high heat dissipating efficiency.

2. Description of Related Art

Electronic devices in computers, such as central processing units (CPUs), generate a lot of heat during normal operation, which can deteriorate their operational stability, and damage associated electronic devices. Thus, the heat must be removed quickly to ensure normal operation of the CPU.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
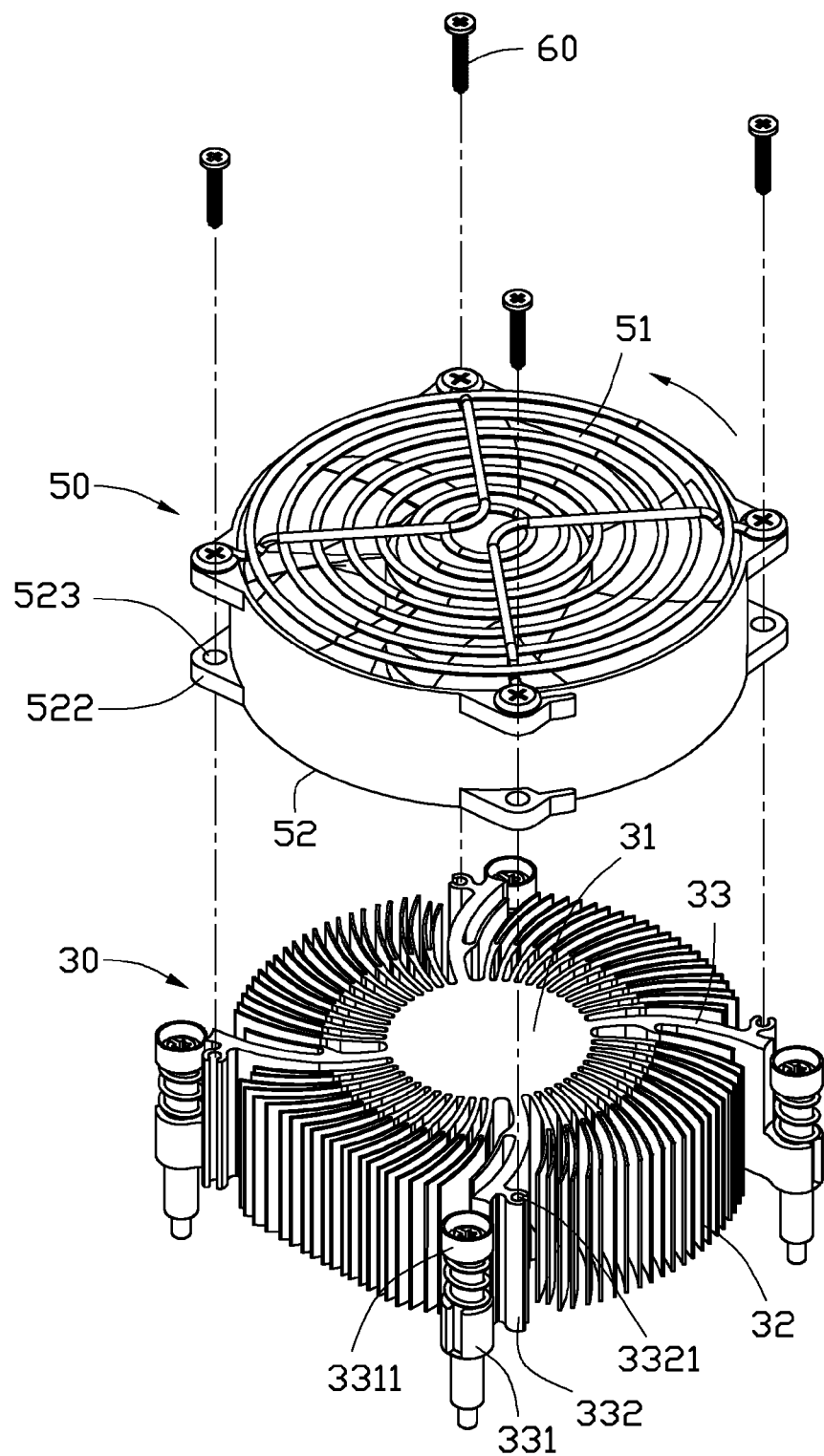
FIG. 1 is an exploded, isometric view of a heat dissipating device of an embodiment, the heat dissipating device including a fan and a heat sink.
Figure 2:
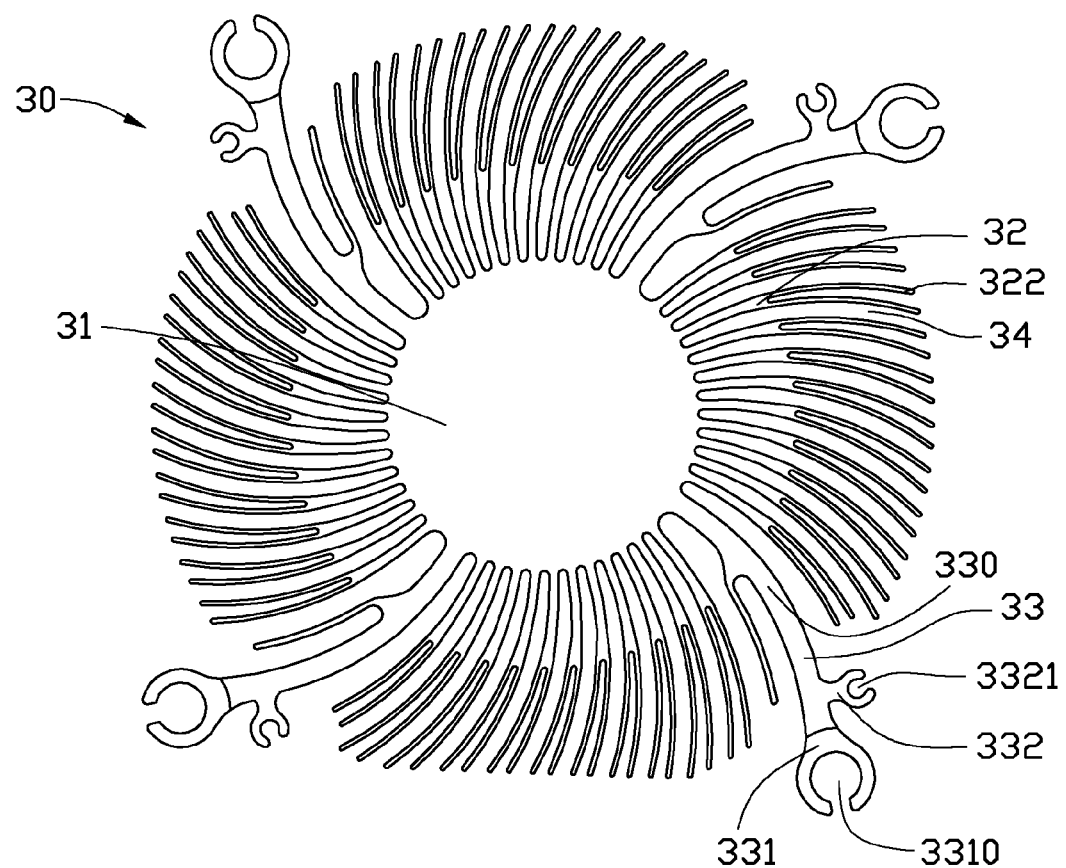
FIG. 2 is a top view of the heat sink of FIG. 1.

Referring to FIGS. 1 and 2, a heat dissipating device 10 includes a heat sink 30 and a fan 50.

The heat sink 30 includes a columnar base 31, a plurality of fins 32 extending radially from the base 31, and four securing portions 33 extending from the base 31. The base 31 is configured to contact a heat generating element. The base 31 defines an axis in the center thereof. Each securing portion 33 includes an arm 330 extending integrally and radially from the base 31, a first mounting portion 331 and a second mounting portion 332 extending integrally from the arm 330. The first mounting portion 331 defines a mounting hole 3310. The first mounting portion 331 includes a fastener 3311 received in the mounting hole 3310 capable of securing the heat sink 30 to a motherboard. The second mounting portion 332 defines a securing hole 3321. Each fin 32 is generally rectangle-shaped. Each fin 32 includes an arcuate end portion 322. The end portions 322 extend about the axis of the base 31 in a clockwise direction 31. A gap 34 is defined between two adjacent fins 32.

The fan 50 defines a first opening 51 and a second opening 52 perpendicular to the first opening 51. In one embodiment, the first opening 51 is used as an air input, and the second opening 52 is used as an air output. The fan 50 is pivoted about the axis of the base 31 in an anti-clockwise direction. The fan 50 includes fastening portions 522 adjacent to the second opening 52. Each fastening portion 522 defines a fastening hole 523.

Figure 3:
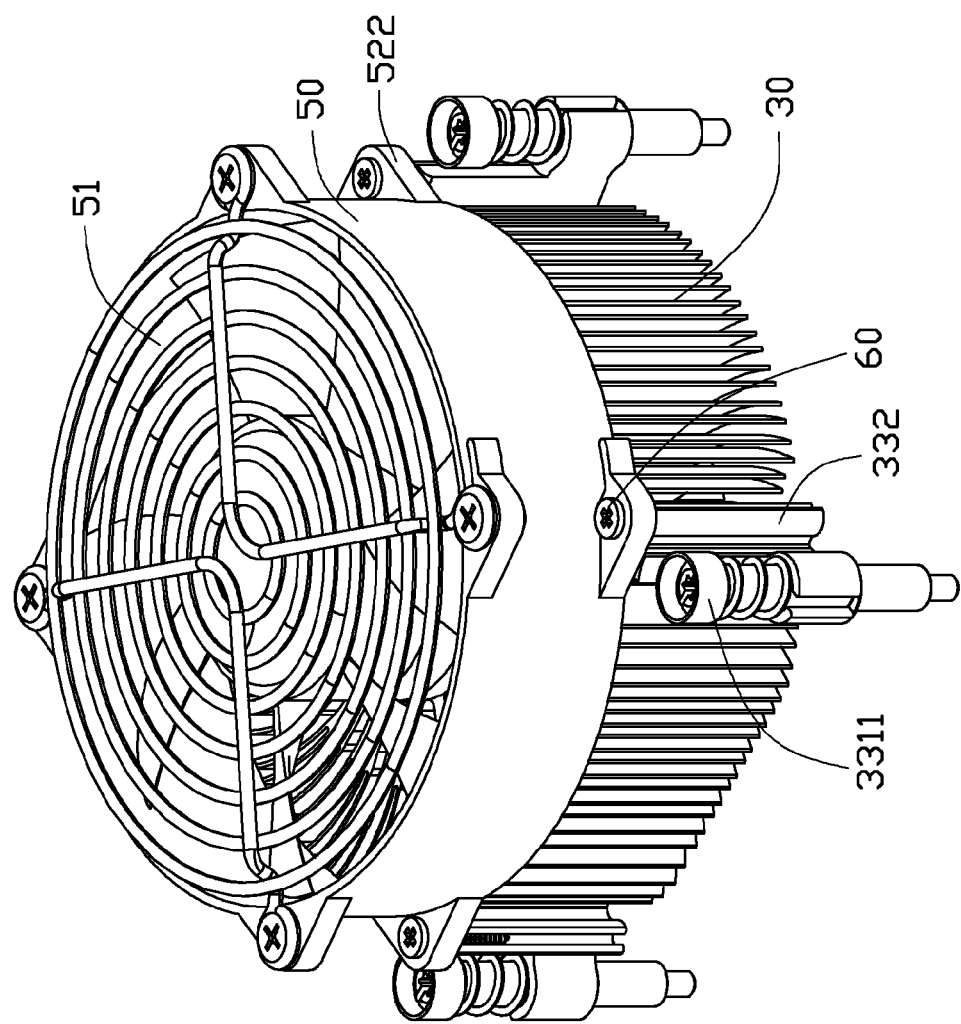
FIG. 3 is an assembled view of FIG. 1.

Referring to FIGS. 1 through 3, in assembly, the fastening holes 511 of the fan 50 are aligned with the securing holes 3321 of the heat sink 30 respectively. Fasteners 60 are respectively extended through the fastening holes 523 of the fan 50 and then screwed into the securing holes 3321 of the heat sink 30 to secure the fan 50 and the heat sink 30 together. At this time, the fins 32 of the heat sink 30 are perpendicular to the second opening 52 of the fan 50.

Air flows into the gaps 34 of the heat sink 30 downwardly in an anti-clockwise direction when the fan 50 is operating and pivoted about the axis of the base 31 in an anti-clockwise direction, while the fins 32 of the heat sink 30 extend about the axis of the base 31 in a clockwise direction, thereby the heat dissipating device 10 enhances the speed of airflow to improve the heat dissipating efficiency of the heat dissipating device 10.

In another embodiment, the first opening 51 of the fan 50 is used as an output, and the second opening 52 is used as an input. Air flows out of the gaps 34 of the heat sink 30 upwardly. The fan 50 is pivoted about the axis of the base 31 in a clockwise direction, and the end portions 322 extend about the axis of the base 31 in an anti-clockwise direction.

It is to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipating device, comprising:
a heat sink comprising a base configured to contact a heat generating element, a plurality of securing portions, and a plurality of fins extending from the base; the base defining an axis in a centre of the base; each fin comprising an end portion extending about the axis of the base in one of a clockwise direction and an anti-clockwise direction, each securing portion comprising an arm extending integrally and radially from the base, a first mounting portion, and a second mounting portion extending integrally from the arm, the arm extending about the axis in the one of the clockwise direction and the anti-clockwise direction, the second mounting portion defining a securing hole, the first mounting portion configured to secure the heat sink to a printed circuit board having the heat generating element; and
a fan placed on the heat sink, the fan operating and pivoted about the axis in the other one of the clockwise direction and the anti-clockwise direction, the fan comprises a fastening portion, the fastening portion defines a fastening hole corresponding to the securing hole.

2. The heat dissipating device of claim 1, wherein the plurality of fins extends radially from the base.

3. The heat dissipating device of claim 1, wherein the end portion is arcuate.

4. The heat dissipating device of claim 1, wherein the fan defines a first opening and a second opening, and the plurality of fins is perpendicular to the second opening.

5. The heat dissipating device of claim 4, wherein the first opening is configured to allow airflow to flow into the fan, and the second opening is configured to allow airflow to flow out of the fan.

6. The heat dissipating device of claim 4, wherein the second opening is configured to allow airflow to flow into the fan, and the first opening is configured to allow airflow to flow out of the fan.

7. The heat dissipating device of claim 1, wherein the base is column-shaped.

8. The heat dissipating device of claim 1, wherein the first mounting portion defines a mounting hole, the first mounting portion the heat sink comprises a fastener received in the mounting hole to secure to the printed circuit board.

9. A heat dissipating device, comprising:
a heat sink comprising a base configured to contact a heat generating element, a plurality of securing portions, and a plurality of fins extending from the base; the base defining an axis in a centre of the base; each fin comprising an end portion extending about the axis of the base in one of a clockwise direction and an anti-clockwise direction; a gap defined between any two adjacent fins of the plurality of fins, each securing portion comprising an arm extending integrally and radially from the base, a first mounting portion, and a second mounting portion extending integrally from the arm, the arm extending about the axis in the one of the clockwise direction and the anti-clockwise direction, the second mounting portion defining a securing hole, the first mounting portion configured to secure the heat sink to a printed circuit board having the heat generating element; and
a fan placed on the heat sink, the fan defining a first opening and a second opening adjacent to the base, the first opening configured to allow airflow to flow into the fan, and the second opening configured to allow airflow to flow from the fan to the gaps of the heat sink; the fan operating and pivoted in the other one of the clockwise direction and the anti-clockwise direction encircling the axis of the base, the fan comprising a fastening portion, the fastening portion defining a fastening hole corresponding to the securing hole.

10. The heat dissipating device of claim 9, wherein the plurality of fins extends radially from the base.

11. The heat dissipating device of claim 9, wherein the end portion is arcuate.

12. The heat dissipating device of claim 9, wherein the plurality of fins is perpendicular to the second opening.

13. The heat dissipating device of claim 9, wherein the base is column-shaped.

14. The heat dissipating device of claim 9, wherein the first mounting portion defines a mounting hole, the first mounting portion the heat sink comprises a fastener received in the mounting hole to secure to the printed circuit board.

* * * * *